US010847777B2

(12) United States Patent
DeKeuster et al.

(10) Patent No.: US 10,847,777 B2
(45) Date of Patent: Nov. 24, 2020

(54) VENT SHIELD FOR A BATTERY MODULE (71) Applicant: CPS Technology Holdings LLC, New York, NY (US)

(72) Inventors: Richard M. DeKeuster, Racine, WI (US); Dale B. Trester, Milwaukee, WI (US)

(73) Assignee: CPS Technology Holdings LLC, New York, NY (US)

( * ) Notice: Subject to any disclaimer, the term of this patent is extended or adjusted under 35 U.S.C. 154(b) by 1 day.

(21) Appl. No.: 15/997,507

(22) Filed: Jun. 4, 2018

(65) Prior Publication Data

US 2018/0287126 A1 Oct. 4, 2018

Related U.S. Application Data (62) Division of application No. 14/634,546, filed on Feb. 27, 2015, now Pat. No. 9,991,501.

(Continued)

(51) Int. Cl.
*H01M 2/12* (2006.01)
*H01M 2/30* (2006.01)
(Continued)

(52) U.S. Cl.
CPC ........ *H01M 2/305* (2013.01); *G01R 31/3835* (2019.01); *G01R 31/396* (2019.01); *H01M 2/02* (2013.01); *H01M 2/04* (2013.01); *H01M 2/10* (2013.01); *H01M 2/1005* (2013.01); *H01M 2/1016* (2013.01); *H01M 2/1072* (2013.01);
(Continued)

(58) Field of Classification Search
None
See application file for complete search history.

(56) References Cited

U.S. PATENT DOCUMENTS 4,127,702 A 11/1978 Catanzarite
4,278,742 A 7/1981 Oxenreider et al.
(Continued)

FOREIGN PATENT DOCUMENTS

AU 2002344718 B2 12/2007
CA 2787507 A1 8/2011
(Continued)

OTHER PUBLICATIONS

PCT/US2016/013739 International Search Report dated Mar. 30, 2016.

*Primary Examiner* — Eli S Mekhlin
(74) *Attorney, Agent, or Firm* — Boardman & Clark LLP (57) ABSTRACT The present disclosure relates generally to a battery module having a housing and a stack of battery cells disposed in the housing. Each battery cell has a battery cell terminal and a battery cell vent on an end of each battery cell, and the battery cell vent is configured to exhaust effluent into the housing. The battery module has a vent shield plate disposed in the housing and directly along an immediate vent path of the effluent, a first surface of the vent shield plate configured to direct the effluent to an opening between the shield plate and the housing, and a second surface of the vent shield plate opposite the first surface. The battery module also has a venting chamber coupled to the opening and at least partially defined by the second surface and a vent configured to direct the effluent out of the battery module.

11 Claims, 10 Drawing Sheets

Related U.S. Application Data (60) Provisional application No. 62/100,001, filed on Jan. 5, 2015.

(51) Int. Cl.

| | | |
|---|---|---|
| *H01M 2/10* | (2006.01) | |
| *H01M 10/052* | (2010.01) | |
| *H01M 2/20* | (2006.01) | |
| *H01M 2/22* | (2006.01) | |
| *H01M 2/32* | (2006.01) | |
| *G01R 31/396* | (2019.01) | |
| *G01R 31/3835* | (2019.01) | |
| *H01M 2/02* | (2006.01) | |
| *H01M 2/04* | (2006.01) | |
| *H01M 2/34* | (2006.01) | |
| *H01M 10/02* | (2006.01) | |
| *H01M 10/60* | (2014.01) | |
| *H01M 10/65* | (2014.01) | |
| *H01M 10/48* | (2006.01) | |
| *H01M 10/613* | (2014.01) | |
| *H01M 10/625* | (2014.01) | |
| *H01M 10/647* | (2014.01) | |
| *H01M 10/653* | (2014.01) | |
| *H01M 10/6551* | (2014.01) | |
| *H01M 10/0525* | (2010.01) | |
| *H01M 10/42* | (2006.01) | |
| *H01M 2/24* | (2006.01) | |
| *H01M 10/6557* | (2014.01) | |
| *H01M 2/18* | (2006.01) | |
| *H01M 10/04* | (2006.01) | |
| *H01M 10/058* | (2010.01) | |

(52) U.S. Cl.
CPC ....... *H01M 2/1077* (2013.01); *H01M 2/1083* (2013.01); *H01M 2/12* (2013.01); *H01M 2/1205* (2013.01); *H01M 2/1211* (2013.01); *H01M 2/1217* (2013.01); *H01M 2/1241* (2013.01); *H01M 2/1252* (2013.01); *H01M 2/1294* (2013.01); *H01M 2/18* (2013.01); *H01M 2/20* (2013.01); *H01M 2/206* (2013.01); *H01M 2/22* (2013.01); *H01M 2/24* (2013.01); *H01M 2/30* (2013.01); *H01M 2/32* (2013.01); *H01M 2/34* (2013.01); *H01M 10/02* (2013.01); *H01M 10/0413* (2013.01); *H01M 10/052* (2013.01); *H01M 10/058* (2013.01); *H01M 10/0525* (2013.01); *H01M 10/4207* (2013.01); *H01M 10/4257* (2013.01); *H01M 10/482* (2013.01); *H01M 10/60* (2015.04); *H01M 10/613* (2015.04); *H01M 10/625* (2015.04); *H01M 10/647* (2015.04); *H01M 10/65* (2015.04); *H01M 10/653* (2015.04); *H01M 10/6551* (2015.04); *H01M 10/6557* (2015.04); *H01M 2010/4271* (2013.01); *H01M 2220/10* (2013.01); *H01M 2220/20* (2013.01)

(56) References Cited

U.S. PATENT DOCUMENTS

| | | |
|---|---|---|
| 5,681,668 A | 10/1997 | Reed et al. |
| 6,045,934 A | 4/2000 | Enami |
| 6,087,038 A | 7/2000 | Flament et al. |
| 6,593,027 B1 | 7/2003 | Osterhart et al. |
| 6,890,490 B1 | 5/2005 | Fujita et al. |
| 7,041,406 B2 | 5/2006 | Schuler et al. |
| 7,314,676 B2 | 1/2008 | Hartnack et al. |
| 7,514,174 B2 | 4/2009 | Nanno et al. |
| 7,846,572 B2 | 12/2010 | Wood et al. |
| 8,076,041 B2 | 12/2011 | Kato et al. |
| 2004/0234837 A1 | 11/2004 | Dan |
| 2005/0141154 A1* | 6/2005 | Consadori ............ B60R 16/023 361/62 |
| 2005/0147874 A1 | 7/2005 | Andersen et al. |
| 2005/0162829 A1 | 7/2005 | Aker et al. |
| 2005/0260482 A1 | 11/2005 | Frank et al. |
| 2007/0122587 A1* | 5/2007 | Mitic ................. H05K 7/20509 428/105 |
| 2008/0076016 A1 | 3/2008 | Ghosh et al. |
| 2009/0274952 A1 | 11/2009 | Wood et al. |
| 2009/0317695 A1* | 12/2009 | Wood .................... H01M 2/105 429/53 |
| 2011/0020676 A1 | 1/2011 | Kurosawa |
| 2011/0111273 A1 | 5/2011 | Okada et al. |
| 2011/0111311 A1 | 5/2011 | Sato et al. |
| 2011/0117401 A1* | 5/2011 | Lee .................... H01M 2/0245 429/82 |
| 2012/0115015 A1 | 5/2012 | Park et al. |
| 2012/0244404 A1 | 9/2012 | Obasih et al. |
| 2013/0071706 A1 | 3/2013 | Lee |
| 2014/0093755 A1 | 4/2014 | Houchin-Miller et al. |
| 2014/0154541 A1 | 6/2014 | Asakura et al. |
| 2014/0234677 A1* | 8/2014 | Yoon ...................... H01M 2/12 429/89 |
| 2015/0069829 A1 | 3/2015 | Dulle et al. |

FOREIGN PATENT DOCUMENTS

| | | |
|---|---|---|
| CA | 2815851 A1 | 11/2013 |
| CN | 201225150 | 4/2009 |
| CN | 102694187 | 11/2014 |
| EP | 2775557 A1 | 9/2014 |
| GB | 2450042 | 2/2012 |
| JP | 2001313487 | 11/2001 |
| JP | 2005071917 | 3/2005 |
| JP | 2008270122 | 11/2008 |
| JP | 2013235852 | 11/2013 |
| JP | 2014107186 | 6/2014 |
| KR | 20140015859 | 2/2014 |

\* cited by examiner

VENT SHIELD FOR A BATTERY MODULE

CROSS REFERENCE TO RELATED APPLICATIONS

This application is a divisional of U.S. patent application Ser. No. 14/634,546, entitled "VENT SHIELD FOR A BATTERY MODULE," filed Feb. 27, 2015, U.S. Pat. No. 9,991,501, which claims priority from and the benefit of U.S. Provisional Application Ser. No. 62/100,001, entitled "MECHANICAL AND ELECTRICAL ASPECTS OF LITHIUM ION BATTERY MODULE WITH VERTICAL AND HORIZONTAL CONFIGURATIONS," filed Jan. 5, 2015, which are hereby incorporated by reference for all purposes.

BACKGROUND

The present disclosure relates generally to the field of batteries and battery modules. More specifically, the present disclosure relates to a vent shield for a battery module.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Start-Stop" system similar to the mild hybrids, but the micro-hybrid systems may or may not supply power assist to the internal combustion engine and operate at a voltage below 60V. For the purposes of the present discussion, it should be noted that mHEVs typically do not technically use electric power provided directly to the crankshaft or transmission for any portion of the motive force of the vehicle, but an mHEV may still be considered an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery module. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles and other implementations. For example, battery modules may be subject to releases of pressurized gas from electrochemical cells to prevent issues related to accumulated pressure within the cells. It is now recognized that improved techniques for venting gases from battery modules may be desirable to avoid issues associated with accumulation of gases in the battery module. For example, in certain configurations, the vented gases may be expelled from the electrochemical cells near module components, which may be negatively impacted by the temperature and/or composition of the vented gases. Accordingly, it may be desirable to mitigate such negative impacts by re-directing a flow of the gases out of the battery module.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a battery module that includes a housing and a first stack of battery cells disposed in the housing, wherein each battery cell of the first stack of battery cells comprises a battery cell terminal and a battery cell vent, the battery cell terminal and the battery cell vent are on an end of each battery cell, and the battery cell vent is configured to exhaust battery cell effluent into the housing. Additionally, the battery module has a first vent shield plate disposed in the housing and directly along an immediate vent path of the battery cell effluent, a first surface of the first vent shield plate configured to direct the battery cell effluent to an opening between an edge of the first shield plate and the housing, and a second surface of the first vent shield plate opposite the first surface. The battery module also includes a venting chamber fluidly coupled to the opening and at least partially defined by the second surface and a vent fluidly coupled to the venting chamber and configured to direct the battery cell effluent out of the battery module.

The present disclosure also relates to a battery module that includes a stack of lithium-ion battery cells disposed in a housing, wherein each lithium-ion battery cell of the stack of lithium-ion battery cells comprises a battery cell terminal and a battery cell vent, the battery cell terminal and the battery cell vent are on an end of each lithium-ion battery cell, and the battery cell vent is configured to exhaust battery cell effluent into the battery module. The battery module also has a vent shield plate disposed directly along an immediate vent path of the battery cell effluent, a first surface of the vent shield plate configured to direct the battery cell effluent to an opening between an edge of the shield plate and the housing, and a second surface of the vent shield plate opposite the first surface. Finally, the battery module has a vent structure configured to direct the battery cell effluent out of the battery module, a venting chamber of the vent structure fluidly coupled to the opening and at least partially defined by the second surface, and a vent of the venting structure fluidly coupled to the venting chamber.

The present disclosure further relates to a battery module that includes a housing and a receptacle of the housing configured to receive a stack of battery cells, wherein each battery cell of the stack of battery cells has an end comprising a battery cell terminal and a battery cell vent, and the battery cell vent is configured to exhaust battery cell effluent. The battery module also has an integrated sensing and bus bar subassembly positioned directly along a vent path of the battery cell effluent, a carrier of the integrated sensing and bus bar subassembly, a bus bar of the integrated sensing and bus bar subassembly integrated onto the carrier and configured to electrically couple battery cells of the stack of battery cells in an electrical arrangement, a sensor of the integrated sensing and bus bar subassembly disposed on the bus bar and configured to enable sensing of a voltage across the bus bar or sensing of a temperature at the bus bar, and a vent shield plate of the integrated sensing and bus bar subassembly disposed on the carrier between the battery cells of the stack of battery cells and the sensor disposed on the bus bar. The vent shield plate is configured to absorb kinetic energy and thermal energy from the battery cell effluent and to direct the battery cell effluent to an opening in the integrated sensing and bus bar subassembly. Finally, the battery module includes a module cover disposed over the integrated sensing and bus bar subassembly and against the housing, wherein the module cover and the integrated sensing and bus bar subassembly at least partially define a venting chamber configured to receive the battery cell effluent after the battery cell effluent has passed through the opening, and wherein the module cover comprises a vent configured to direct the battery cell effluent out of the battery module.

DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Battery modules, in accordance with the present disclosure may be configured to release pressurized gases into the housing of the battery module. For example, the electrochemical cells may be susceptible to increases in heat, during normal and/or abnormal operation, causing an increase in internal pressure. Vents may be integrated into the electrochemical cells to enable the release of the pressurized gases. However, because the battery modules often include temperature sensitive components (e.g., electronics, sensors), the pressurized gases may be directed out of the battery module via a desired venting path to mitigate any damage to the sensitive battery module components.

Accordingly, the battery module housing may include a vent structure (e.g., vent shield, venting chamber, vent, module cover, housing, etc.) configured to direct pressurized gases away from the electrochemical cells and other temperature sensitive components along the venting path. For example, a vent chamber may be aligned with the electrochemical cell vents to collect and receive the vented gases. Moreover, the vent chamber may be fluidly connected to an internal portal to direct the gases through a guiding chamber for expulsion out of the battery module. In certain embodiments, the vent chamber includes recesses configured to receive plates. For example, the plates may be configured to redirect the flow of pressurized gases toward the internal portal. Moreover, the vent structure may be configured to couple to a cover of the battery module to further direct flow of the pressurized gases out of the battery module. In some embodiments, the vent structure may be at least partially defined by the battery module housing.

The present disclosure includes embodiments of a battery module having a vent shield configured to block gases vented from the electrochemical cells from contacting and/or overheating electrical components disposed within a general direction in which the gases are ejected. Although discussion of the present disclosure is mainly focused on battery modules that include lithium ion battery cells, it should be noted that the disclosed embodiments may be used in any battery module configuration that may benefit from the present techniques.

Figure 1:
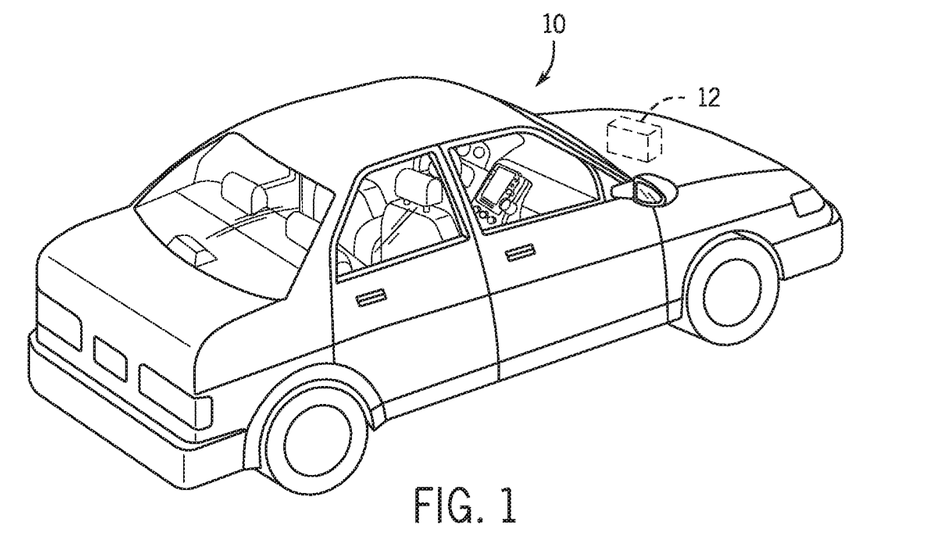
FIG. 1 is a perspective view of an xEV having a battery system configured to provide power for various components of the xEV, in accordance with an aspect of the present disclosure.

To help illustrate, FIG. 1 is a perspective view of an embodiment of a vehicle 10, which may utilize a battery system 12 that includes one or more vent shields described in the present disclosure. It is now recognized that it is desirable for the non-traditional battery system 12 (e.g., a lithium ion car battery having a vent shield) to be largely compatible with traditional vehicle designs. In this respect, present embodiments include various types of battery modules for xEVs and systems that include xEVs. Accordingly, the battery system 12 may be placed in a location in the vehicle 10 that would have housed a traditional battery system (e.g., a standard 12V lead acid battery or a 12V lithium ion battery with no vent shield). For example, as illustrated, the vehicle 10 may include the battery system 12 positioned similarly to a lead-acid battery of a combustion-engine vehicle (e.g., under the hood of the vehicle 10).

Figure 2:
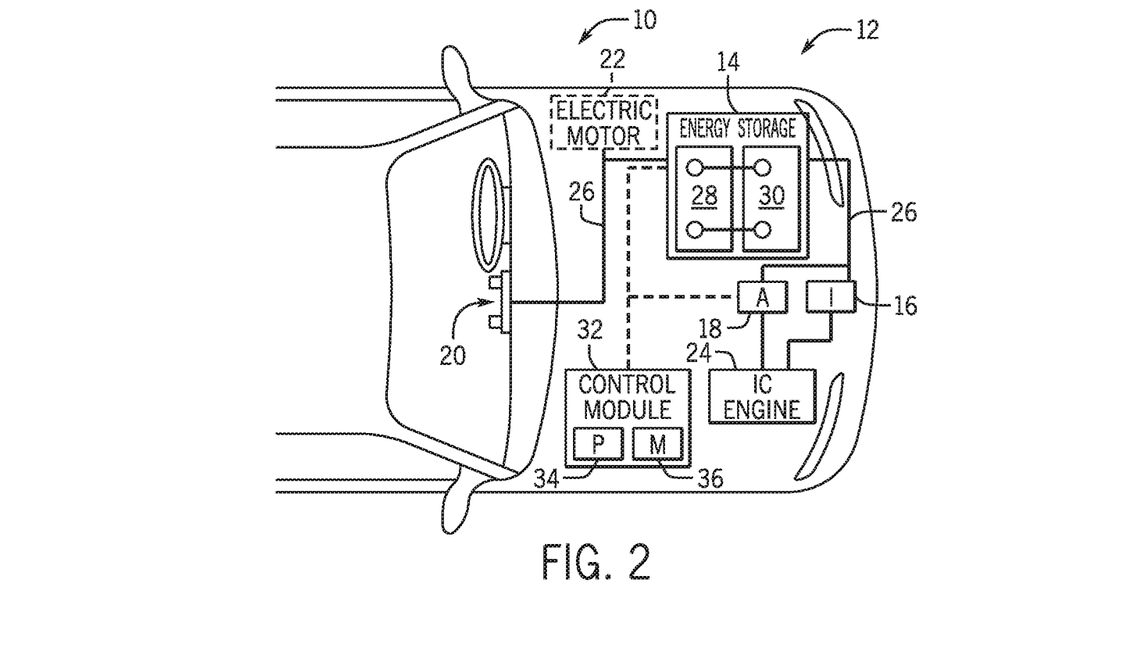
FIG. 2 is a cutaway schematic view of an embodiment of the xEV that utilizes the battery system of FIG. 1, in accordance with an aspect of the present disclosure.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical components in the vehicle 10. Additionally, the energy storage component 14 may output electrical energy to start (e.g., re-start or re-ignite) an internal combustion engine 24. For example, in a start-stop application, to preserve fuel, the internal combustion engine 24 may idle when the vehicle 10 stops. Thus, the energy storage component 14 may supply energy to re-start the internal combustion engine 24 when propulsion is demanded by the vehicle 10.

The battery system 12 may also supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. In the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally, or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20.

Additionally, as depicted, the energy storage component 14 may include multiple battery modules. For example, in the depicted embodiment, the energy storage component 14 includes a lithium ion (e.g., a first) battery module 28 and a lead acid (e.g., a second) battery module 30, which each includes one or more battery cells. Additionally, the energy storage component 14 may include any number of battery modules, all or some of which may include protective vent shields. Although the lithium ion battery module 28 and lead-acid battery module 30 are depicted adjacent to one another, they may be positioned in different areas around the vehicle. For example, the lead-acid battery module 30 may be positioned in or about the interior of the vehicle 10 while the lithium ion battery module 28 may be positioned under the hood of the vehicle 10.

In some embodiments, the energy storage component 14 may include multiple battery modules to utilize multiple different battery chemistries. For example, when the lithium ion battery module 28 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32 (e.g., a battery management system). More specifically, the control module 32 may control operations of components in the battery system 12, such as relays (e.g., switches) within the energy storage component 14, the alternator 18, and/or the electric motor 22. For example, the control module 32 may regulate an amount of electrical energy captured/supplied by each battery module 28 or 30 (e.g., to de-rate and re-rate the battery system 12), perform load balancing between the battery modules 28 and 30, determine a state of charge of each battery module 28 or 30, determine a temperature or voltage of each battery module 28 or 30 (e.g., via a signal received from one or more sensing components), control voltage output by the alternator 18 and/or the electric motor 22, and the like.

Accordingly, the control unit 32 may include one or more processor units 34 and one or more memory components 36. More specifically, the one or more processor units 34 may include one or more application specific integrated circuits (ASICs), one or more field programmable gate arrays (FPGAs), one or more general purpose processors, or any combination thereof. Additionally, the one or more memory components 36 may include volatile memory, such as random access memory (RAM), and/or non-volatile memory, such as read-only memory (ROM), optical drives, hard disc drives, or solid-state drives. In some embodiments, the control unit 32 may include portions of a vehicle control unit (VCU) and/or a separate battery control module. Furthermore, as depicted, the lithium ion battery module 28 and the lead-acid battery module 30 are connected in parallel across their terminals. In other words, the lithium ion battery module 28 and the lead-acid module 30 may be coupled in parallel to the vehicle's electrical system via the bus 26.

As discussed previously, the battery module 28 may experience pressure buildup as a result of accumulation of electrochemical cell effluent gases. The battery module 28 may include components that are sensitive to increased temperatures caused by the effluent or that may be corroded or otherwise subject to damage caused by the chemical makeup of the effluent. Therefore, it may be desirable to include a vent shield in the battery module 28 to direct the effluent along a vent path that may mitigate damage to the sensitive components. It is now recognized that a vent shield positioned directly along the vent path of the effluent may absorb a majority of thermal and kinetic energy from the effluent as well as re-direct the effluent to a venting chamber. Although the vent shield may not completely prevent exposure of the sensitive components to the effluent, it may provide enhanced protection, thereby increasing the life of the battery module 28.

Figure 3:
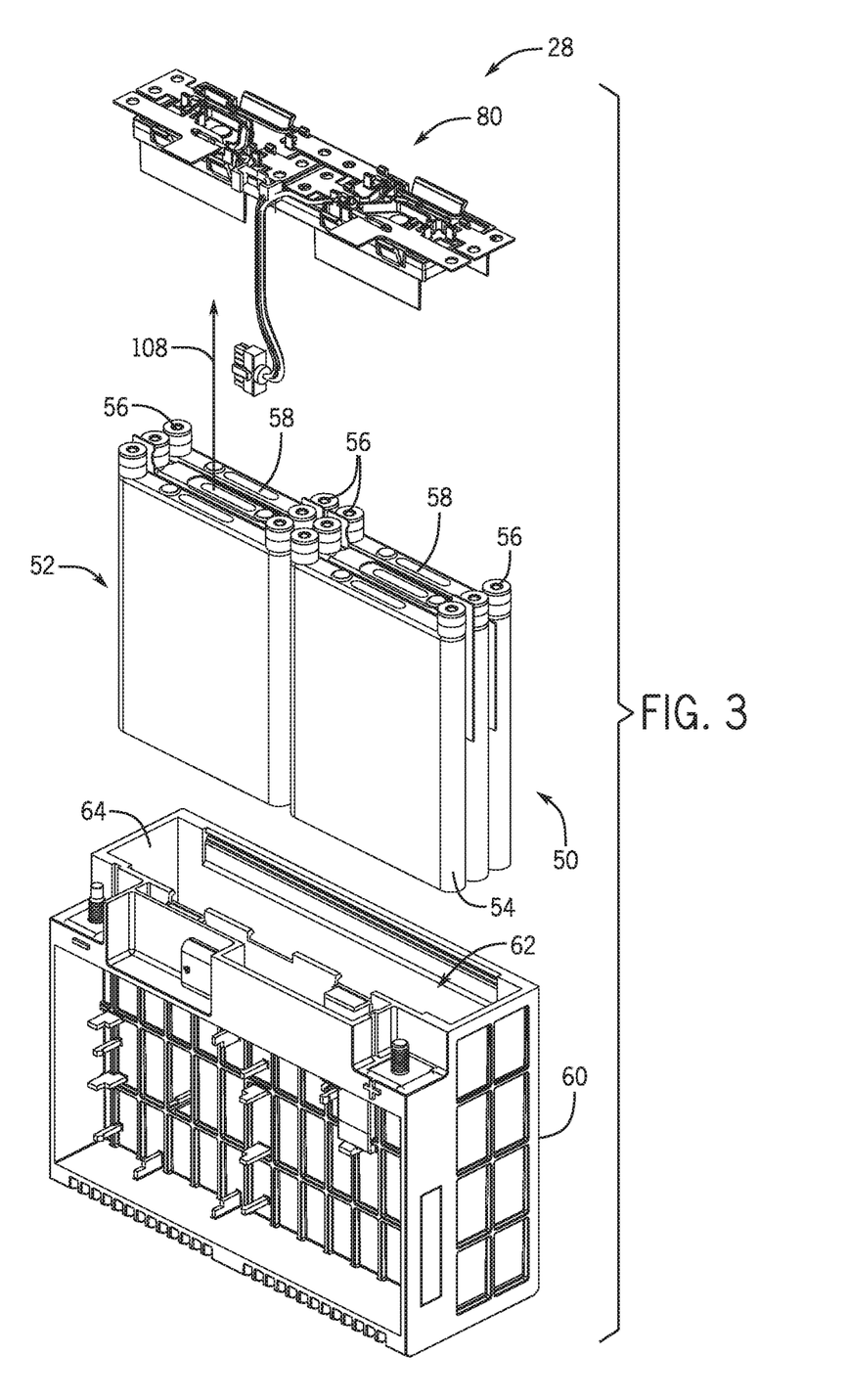
FIG. 3 is an illustration of a battery module that may include a vent shield to block battery cell effluent from contacting and/or overheating sensitive electrical components in the battery module, in accordance with an aspect of the present disclosure.

FIG. 3 illustrates an embodiment of the module 28, which may include the vent shield configured to block the effluent from the electrochemical cells from contacting and/or overheating sensitive electrical components in the battery module 28. The battery module 28 illustrated in FIG. 3 is intended to be representative of one application of the vent shield, and therefore, it should be noted that the vent shield may be included in any battery module (e.g., a lead-acid battery module, a lithium-ion battery module, etc.).

The battery module 28 may include a stack(s) of battery cells 50 and 52, where each individual battery cell 54 includes cell terminals 56 and a cell vent 58. The individual battery cells 54 may be arranged in the stack 50 or 52, where the battery cells 54 are positioned adjacent to one another in orientations where their respective terminals 56 are positioned at the same side of the stack 50 or 52. Accordingly, adjacent battery cells 54 will have terminals 56 that are adjacent to one another in each battery cell stack 50 and 52. As an example, the embodiment illustrated in FIG. 3 includes two side-by-side cell stacks 50 and 52, which may be referred to as a first cell stack 50 and a second cell stack 52.

As shown in FIG. 3, the battery module 28 may include a module housing 60 constructed of any appropriate material, such as an amide-based polymer, a polyolefin (e.g., polypropylene), or any other material. The module housing 60 includes a cell receptacle region 62, where the battery cell stacks 50 and 52 are positioned within the battery module housing 60. In the illustrated embodiment, the battery cells 52 are positioned into the cell receptacle region 62 "bottom first," where the terminals 56 and vents 58 of each battery cell 54, positioned on what may be referred to as a "top" end of the cells 54, point outwardly toward an opening 64 of the receptacle region 62.

Figure 4:
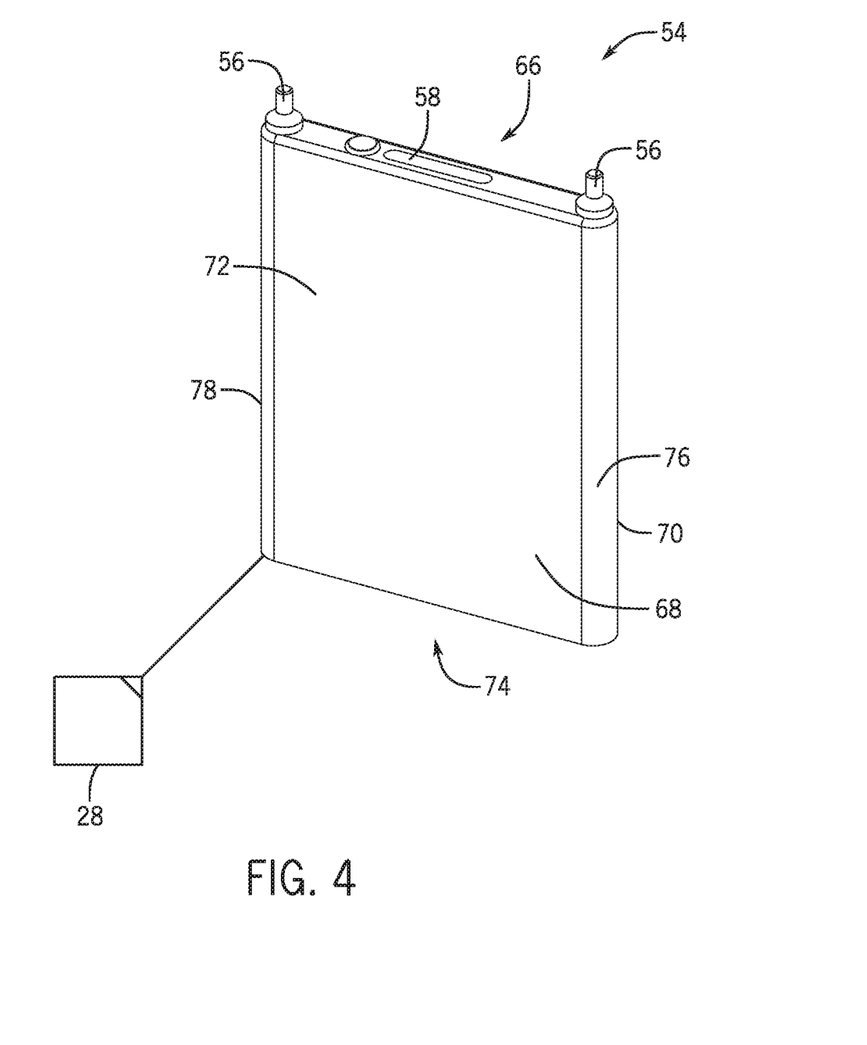
FIG. 4 is an illustration of an embodiment of an individual battery cell that may be included in the battery module of FIG. 3, in accordance with an aspect of the present disclosure.

To facilitate discussion of the present embodiments, FIG. 4 illustrates an embodiment of the individual battery cell 54 of a battery module 28 in accordance with present embodiments to introduce certain terminology used herein to refer to portions of the battery cells 54. In a prismatic cell configuration, as shown in FIG. 4, the battery cells 54 include a top portion 66 having at least one cell terminal 56 (the illustrated embodiment has two cell terminals on the top 66) and a cell vent 58 for allowing pressurized gas to escape during a venting situation. The illustrated battery cell 54 of FIG. 4 also includes first 68 and second 70 faces, corresponding to the broadest part of a casing 72 of the battery cells 54. A bottom part 74 is substantially opposite the top part 66, and may, in some embodiments, include a cell vent 58 in lieu of the cell vent 58 on the top part 66. The faces 68 and 70 extend between the top 66 and bottom 74 portions, and are coupled by first 76 and second 78 sides, which may be straight, rounded, or any other suitable geometry. The casing (housing) 72 of the battery cell, which houses the active electrochemical elements of the cell 54, may be polymeric, metallic, composite, or any other suitable material. Further, it should be noted that the present embodiments are not limited to battery modules 28 having prismatic battery cell configurations, but are also intended to include embodiments where the battery cells 54 are pouch battery cells, cylindrical battery cells, and so forth. Furthermore, while described in the context of a lithium ion battery module 28 having lithium ion battery cells 54, the present disclosure is applicable to other battery chemistries (e.g., lead acid battery cells) that may be subject to venting in the manner described herein.

Figure 5:
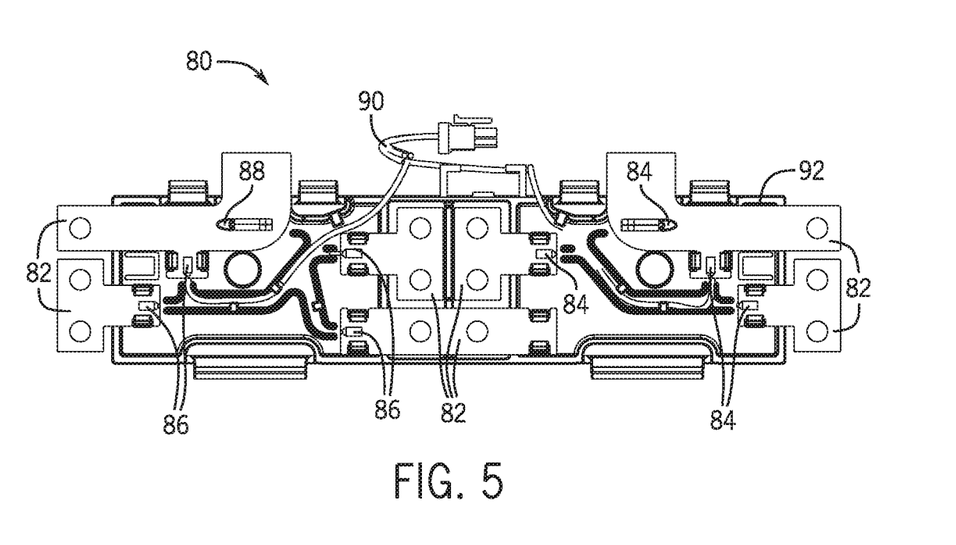
FIG. 5 is an illustration of an embodiment of an integrated sensing and bus bar subassembly that may be included in the battery module of FIG. 3, in accordance with an aspect of the present disclosure.

Additionally, the battery module 28 may include an integrated sensing and bus bar subassembly 80 ("subassembly" or "bus bar subassembly"), as illustrated in FIG. 5. The bus bar subassembly 80 may be positioned adjacent to the top portions 66 of the battery cells 54, thereby enabling the subassembly 80 to electrically interconnect the battery cells 54 in a predetermined relationship via bus bars 82. The interconnection of the battery cells 54 in this manner may enable a plurality of series and/or parallel connections to be made, resulting in a predetermined voltage and/or capacity of the overall battery module 28. In certain embodiments (e.g., the embodiment of FIG. 3), the battery module 28 may have, for example, six battery cells 54 connected in series to produce a voltage output that is the sum of the individual voltages of the battery cells, and a capacity substantially equal to the capacity of an individual cell 54. Other electrical connections, such as one or more parallel connections, would affect the voltage and capacity. In other embodiments, the battery module 28 may include less than six battery cells (e.g., 5, 4, 3, 2, or 1) or more than six battery cells (e.g., 7, 8, 9, 10, 12, 15, 20, 25, 30, 35, 40, 45, 50, or more).

In addition to forming the electrical connections using the bus bars 82 of the subassembly 80, the subassembly 80 also includes various sensing features 84 (e.g., sensing components, sensors, or the like) configured to enable the control unit 32 (e.g., controller or battery management system "BMS") of the module 28 to perform monitoring functions with respect to the battery cells 54 and the module 28. The sensing features 84 (e.g., sensing components, sensors, or the like), as depicted in FIG. 5, include voltage sense components 86, which are configured to sense voltages at each bus bar 82, as well as temperature sense components 88, which are configured to sense temperatures at certain bus bars 82. These sensing components 84 are coupled to cabling 90 configured to carry signals generated by the sensing components 84 to the control unit 32 (e.g., the BMS). For example, the sensing features 84 may be electrically coupled to the control unit 32 (e.g., via the cabling 90) and configured to send signals pertaining to a temperature or a voltage of the battery module 28 over time. In certain embodiments, the control unit 32 may include a threshold temperature and/or voltage value stored in the memory components 36. If a signal received from the sensing features 84 exceeds the threshold value, the control unit 32 may be configured to disconnect a flow of electricity between the battery module 28 and a load, for example.

In certain embodiments, the bus bars 82, the temperature 88 and voltage 86 sense components, and the cabling 90 are all integrated onto a carrier 92, which may form a one-piece structure (e.g., the subassembly) configured to carry and integrate these components. Additionally, the carrier 92 may also include one or more vent shields configured to direct the battery cell effluent along a desired vent path.

As may be appreciated with reference to FIGS. 3-5, the general direction of the cell 54 venting may cause vented gases (e.g., heated $CO_2$, heated vaporized solvent) to contact and/or heat the various electronic components on the carrier 92, thereby causing the sensing components 84, the cabling 90, or both, to degrade. Additionally or alternatively, the connection of the sensing components 84 to the bus bars 82 can also be degraded upon exposure to the vented gases. To mitigate these unwanted effects, one or more shielding features may be integrated into the battery module 28, as will be described in more detail with reference to FIG. 6.

Figure 6:
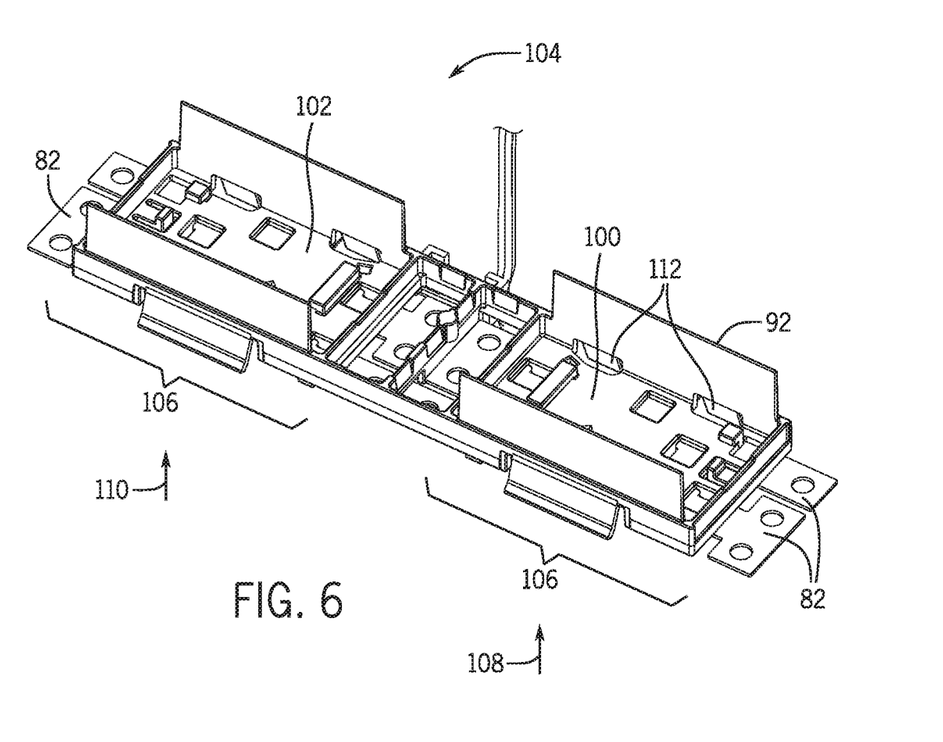
FIG. 6 is an illustration of an embodiment of the integrated sensing and bus bar subassembly of FIG. 5 with a carrier, shield plates, and a bus bar, in accordance with an aspect of the present disclosure.

FIG. 6 is an embodiment of the carrier 92 from a back perspective view, where a first shield plate 100 and a second shield plate 102 are integrated into a carrier assembly 104, which includes the carrier 92, the shield plates 100 and 102, and the bus bars 82. Other components not explicitly illustrated may also be included in the carrier assembly 104. In accordance with present embodiments, the first 100 and second 102 shield plates are located on a portion 106 of the carrier that corresponds to a position between the vents 58 of the battery cells 54 and some or all of the electrical components (e.g., the sensing components 84 and cabling 90). More specifically, the first shield plate 100 may be located within a vent path 108 of the first cell stack 50, thereby blocking effluent from the battery cells 54 of the first stack 50 from contacting the carrier 92 and heating the electrical components of the subassembly 80. Similarly, the second shield plate 102 is located within a vent path 110 of the second cell stack 52, thereby blocking effluent from the battery cells 54 of the second stack 52 from contacting the carrier 92 and heating the electrical components of the subassembly 80. The carrier 92 also includes openings (e.g., channels) 112, which may be configured to allow vented gases to pass beyond the carrier 92 and into a vent chamber, which is described in further detail herein with respect to FIG. 9. In certain embodiments, the openings 112 may be a gap or space between the subassembly 80 and the housing 60. In other embodiments, the openings 112 may be a gap or space between the vent shields 100 and 102 and the housing 60. In still further embodiments, the openings 112 may be holes or channels formed in the carrier 92 itself. The positioning of the shield plates 100 and 102 relative to various electrical components of the module 28 is illustrated in further detail below in FIG. 7.

Figure 7:
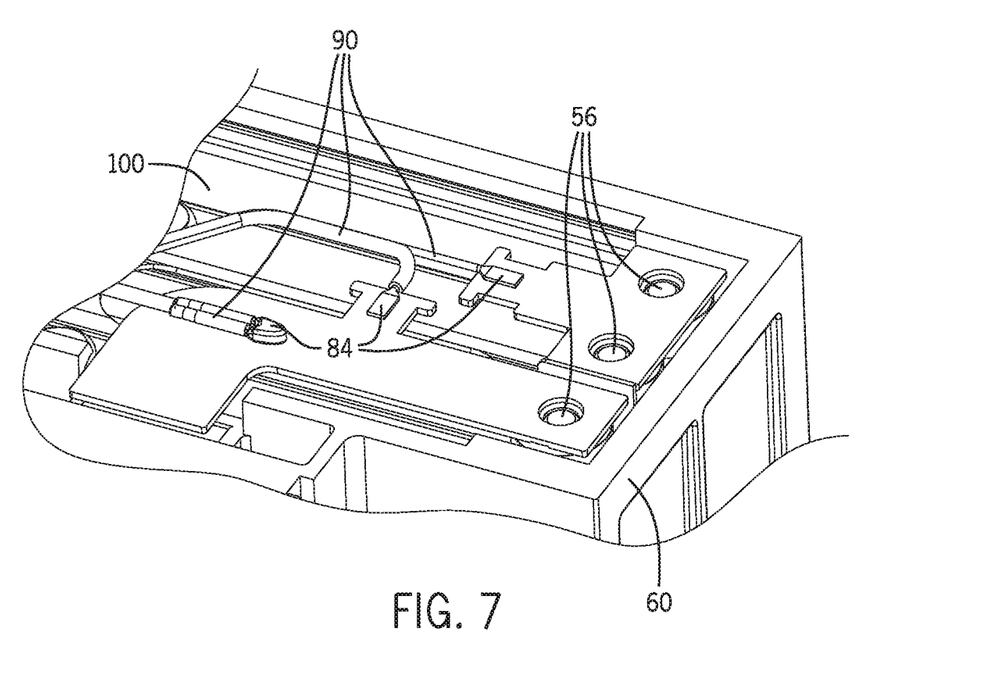
FIG. 7 is an illustration of an embodiment of the integrated sensing and bus bar subassembly of FIG. 6 with the carrier removed to show the position of the shield plate, in accordance with an aspect of the present disclosure.

In FIG. 7, the carrier 92 is removed to more clearly illustrate the position of the shield plate 100 relative to the sensing components 84 and the cabling 90. In accordance with the illustrated embodiment, the vents 58 of the battery cells 54 of the cell stack 50 may be located behind the shield plate 100 within the module housing 60. Accordingly, in certain embodiments, the shield plate 100 is located directly within the path 108 of the vented gases (e.g., directly within the venting direction of the cells 54) to absorb energy from the vented gases (e.g., thermal and kinetic energy) to mitigate damage to the various electrical components of the subassembly 80.

To enable the shield plates 100 and 102 to absorb such energy, the shield plates 100 and 102 may be formed or include any material capable of absorbing and/or quickly dissipating thermal energy from the vented gases. Accordingly, the shield plates 100 and 102 may be formed using materials having a low heat capacity (e.g., lower than the material of the carrier 92), such as aluminum, copper, or any other metallic, ceramic, polymeric, or composite material meeting desired thermal conductivity specifications. In certain embodiments, the vent shields 100 and 102 may have an isotropic thermal conductivity that enables heat to be directed in a particular direction, such as laterally (e.g., along the plane of the vent shields 100 and 102) rather than in the same general direction of venting (e.g., vent paths 108 and 110). Additionally or alternatively, the shield plates 100 and 102 may simply be physical barriers that absorb a certain amount of kinetic and thermal energy from the gases vented by the battery cells 54. In this way, the physical impact and heat that would otherwise be imparted to the carrier 92 is, to a large extent, deposited into the shield plates 100 and 102.

Figure 8:
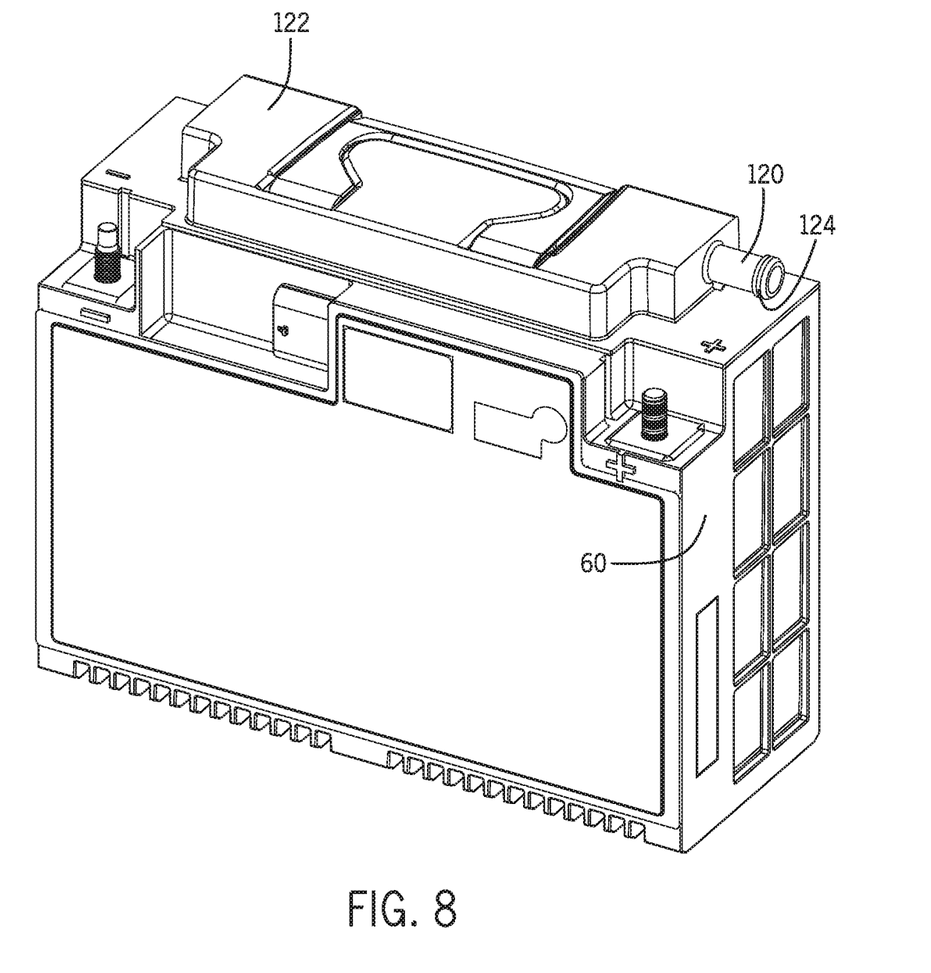
FIG. 8 is an illustration of the battery module of FIG. 3 with a vent, a housing, and a housing cover, in accordance with an aspect of the present disclosure.

The modules 28 of the present disclosure may have a variety of venting configurations that use the shield plates 100 and 102 described above. Generally, gases generated during a venting situation may be moved from the module housing 60, and out of a vent 120 of the battery module 28, as shown in FIG. 8. In certain embodiments, the module housing 60 may include a module housing cover 122 (e.g., a lid) that includes the vent 120. Specifically, gases generated in the interior of the module housing 60 may be directed from the interior, into a venting chamber formed by the housing 60 or the housing cover 122, and out of the module vent 120. As shown, the vent 120 may be in the form of a hose fitting, which may include threads or barbs 124 to enable securement with a vent adapter, a vent hose, or the like. The manner in which vented gases are expelled from the battery module 28 may be further appreciated with reference to FIG. 9.

Figure 9:
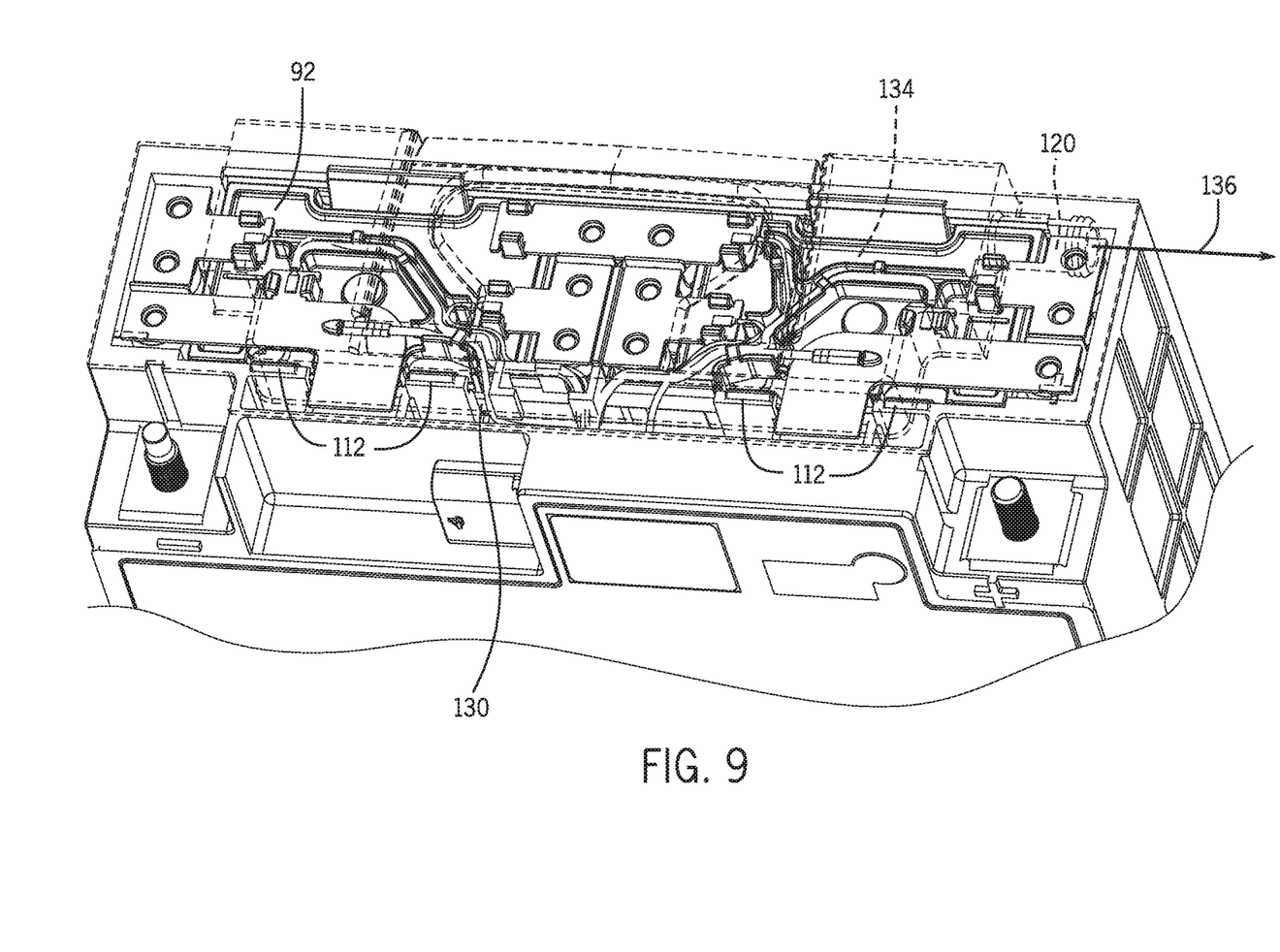
FIG. 9 is an illustration of an embodiment of the battery module of FIGS. 3 and 8 with the battery module housing made transparent, in accordance with an aspect of the present disclosure.

FIG. 9 is a top view of the battery module of FIG. 8, with a top portion of the housing 60 (e.g., the housing cover 122) being made partially transparent to view certain internal features of the module 28 relative to the cover. As shown in the illustrated embodiment, the carrier 92 and various internal surfaces 130 of the housing 60 may produce one or more of the openings 112 that direct vented gases into a venting chamber 134. In other embodiments, the openings 112 may be created by gaps between the internal surfaces 130 and the vent shields 100 and 102. In still further embodiments, the openings 112 may be formed directly in the carrier 92 (e.g., holes formed in the carrier). The venting chamber 134 may be formed between the housing 60 or housing cover 122 and the subassembly 80. Therefore, the subassembly 80 may partially define the venting chamber 134. In certain embodiments, the subassembly 80 may form a bottom wall (e.g., a floor) of the venting chamber 134, such that the subassembly 80 blocks the effluent from flowing back towards the battery cells 54. In other embodiments, the bottom wall (e.g., a floor) of the venting chamber 134 may include the vent shields 100 and/or 102. Once the effluent reaches the venting chamber 134, gases may then be expelled out of the vent 120, as mentioned above.

Figure 10:
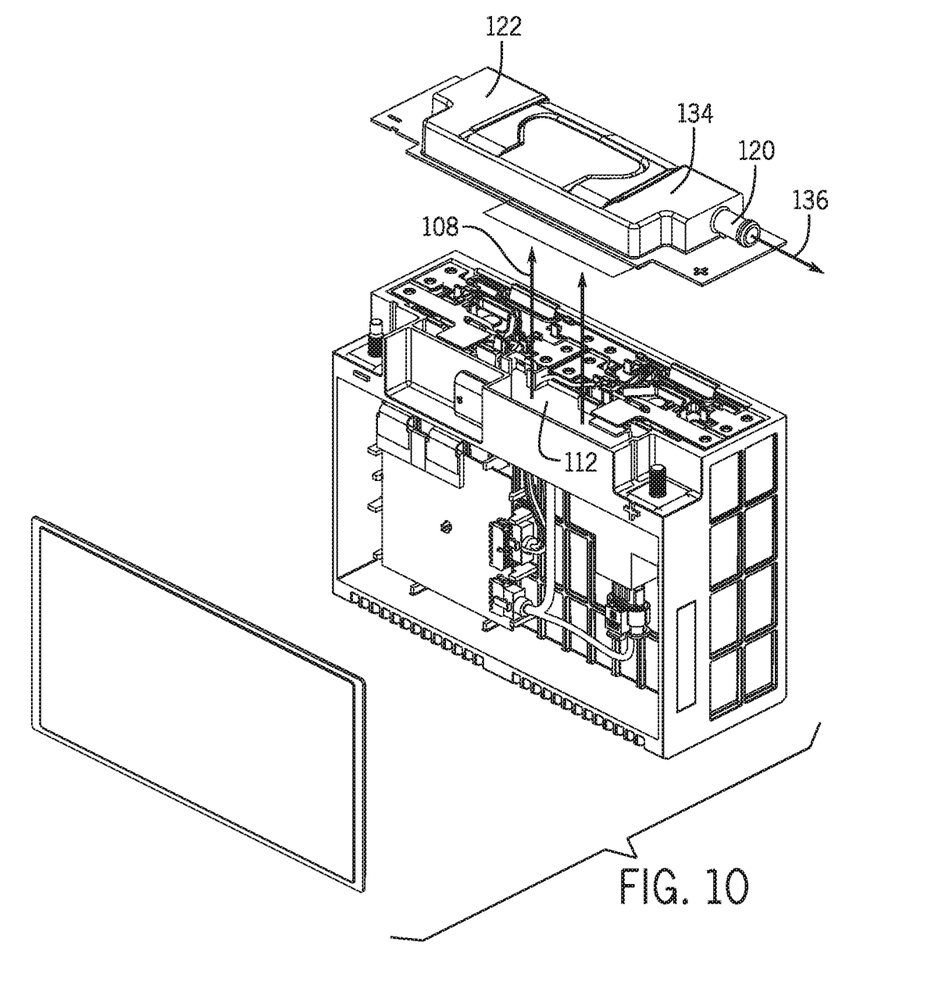
FIG. 10 is an illustration of an embodiment of a vent path of the battery cell effluent, in accordance with an aspect of the present disclosure.

As shown in FIG. 10, the vent pathway 108 may extend from the battery cell vents 58, and into the shield plates 100 and/or 102, which absorb a majority of the kinetic and thermal energy from the vented gases that could otherwise damage the electrical components of the subassembly 80. The vented gases may then pass over the shield plates 100 and 102, for example through the openings 112, and into the venting chamber 134. The gases are then expelled in a direction of expulsion 136 defined by the vent 120.

Figure 11:
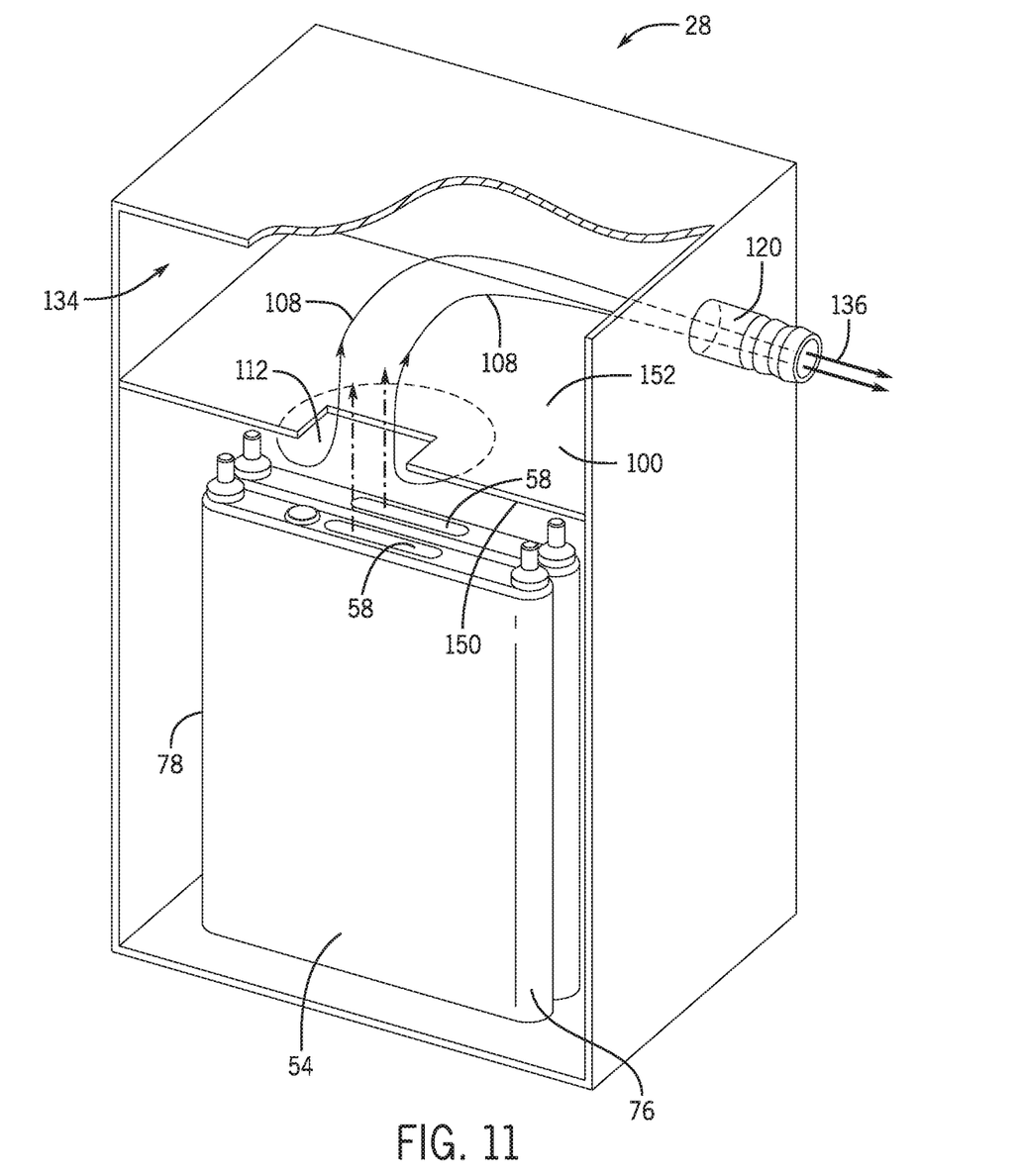
FIG. 11 is an illustration of another embodiment of the vent path of the battery cell effluent, in accordance with an aspect of the present disclosure.

FIG. 11 further illustrates the vent path 108 of the effluent from the battery cells 54. As shown in the illustrated embodiment, effluent flows upwards (e.g., substantially parallel to the first 76 and second 78 sides of the battery cells 54) and out of the vents 58. However, the effluent eventually reaches, and is redirected by, the vent shield 100. Accordingly, the effluent is directed through the opening(s) 112 and into the venting chamber 134. In certain embodiments, the effluent may accumulate in the venting chamber 134 until a pressure in the vent chamber increases to a point where the effluent is urged through the vent 120 and out of the battery module 28 (e.g., the pressure in the venting chamber 134 is greater than the pressure outside the battery module 28 or a threshold pressure associated with opening the vent 120 is reached). In other embodiments, the effluent may simply flow through the venting chamber 134 and out the vent 120 rather than accumulating to any substantial degree in the venting chamber 134.

In certain embodiments, the vent shield 100 absorbs the thermal and kinetic energy from the effluent thereby mitigating any damage to the sensing components 84 of the integrated sensing and bus bar subassembly 80 even though the effluent eventually passes over the sensing components 84 after it flows through the channel(s) 112.

Moreover, as can be seen in FIG. 11, the vent shield 100 may have a first surface 150 and a second surface 152, where the second surface 152 is opposite the first surface 150. The first surface 152 is directly in the flow path 108 of the effluent and contacts the effluent as it exits the cell vents 58. The first surface may initially absorb the kinetic and thermal energy of the effluent and then disperse such energy throughout the remainder of the vent shield 100 (e.g., to a space in the vent shield 100 between the first 150 and second 152 surfaces or to the second surface 152). In certain embodiments, the second surface 152 may be configured to define the venting chamber 134. As shown in the illustrated embodiment of FIG. 11, the second surface 152 creates the bottom wall (e.g., floor) of the venting chamber 134. The second surface 152 may also be proximate to, or incorporated in, the subassembly 80, such that the second surface 152 contacts the effluent at the same time as the sensing components 84 of the subassembly 80. Therefore, although the second surface 152 may increase in temperature as a result of the thermal and kinetic energy being transferred from the first surface 150, the second surface 152 may not directly contact the effluent until after the effluent flows through the opening(s) 112 and into the venting chamber 134.

Figure 12:
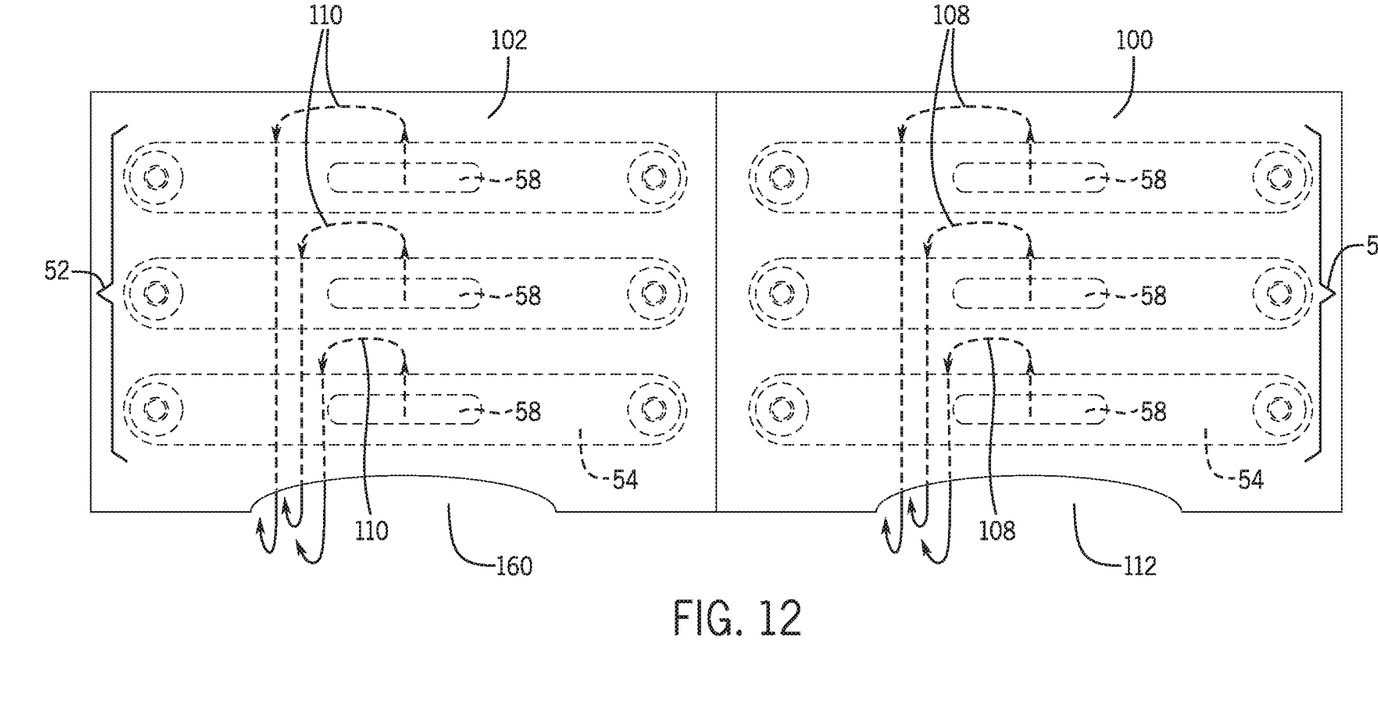
FIG. 12 is a top view of the battery cell effluent vent path of FIG. 11, in accordance with an aspect of the present disclosure.

Similarly, FIG. 12 illustrates the vent paths 108 and 110 of the effluent from a top view of the battery module 28. The illustrated embodiment shows the battery module 28 including the first stack 50 of battery cells 54, the second stack 52 of battery cells 54, the first vent shield 100 (e.g., disposed directly above the first stack 50 of battery cells 54), and the second vent shield 102 (e.g., disposed directly above the second stack 52 of battery cells 54). For example, the effluent exits the cells 54 via the cell vents 58. As shown in the illustrated embodiment, effluent flows upwards (e.g., substantially perpendicular to the first 100 and second 102 vent shields) and out of the vents 58. However, the effluent eventually reaches, and is blocked by, the vent shields 100 and 102. Accordingly, the effluent may flow through the opening 112 and/or a second opening 160 into the venting chamber 134. It should be noted that although the effluent from the first stack 50 of battery cells 54 is illustrated as flowing through the opening 112, the effluent from the first stack 50 may flow through the opening 112, the second opening 160, or both. Similarly, the effluent from the second stack 52 of battery cells 54 may flow through the opening 112, the second opening 160, or both. In certain embodiments, the effluent may accumulate in the venting chamber 134 until a pressure in the vent chamber increases to a point where the effluent is urged through the vent 120 and out of the battery module 28 (e.g., the pressure in the venting chamber 134 is greater than the pressure outside the battery module 28). In other embodiments, the effluent may simply flow through the venting chamber 134 and out the vent 120 rather than accumulating in the venting chamber 134.

In view of the foregoing, it should be appreciated that one or more of the disclosed embodiments, alone or in combination, may be useful for providing the technical effect of reducing thermal and physical stresses placed on certain electronic components of a battery module. For example, in one aspect, it is now recognized that battery cells in a battery module may vent, and the vented materials may physically impact a carrier onto which certain electrical components are integrated. It is also now recognized that the vented materials may also impart thermal energy to the electrical components, and the physical and thermal stresses thereby placed upon the electrical components may result in degradation thereof, reducing the reliability and/or lifetime of the battery module. To mitigate these unwanted effects and to provide other advantages and technical effects, the present disclosure utilizes a vent shield integrated onto a carrier of the electrical components that is placed along a venting path between the battery cell vent and the electrical components, thereby enabling the vent shield to absorb and dissipate kinetic and thermal energy from the gases.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A battery module, comprising:
   a housing;
   a receptacle of the housing configured to receive a stack of battery cells, wherein each battery cell of the stack of battery cells has an end comprising a battery cell terminal and a battery cell vent, and the battery cell vent is configured to exhaust battery cell effluent;
   an integrated sensing and bus bar subassembly positioned directly along a vent path of the battery cell effluent;
   a carrier of the integrated sensing and bus bar;
   a bus bar of the integrated sensing and bus bar subassembly integrated onto the carrier and configured to electrically couple battery cells of the stack of battery cells in an electrical arrangement;

a sensor of the integrated sensing and bus bar subassembly disposed on the bus bar and configured to enable sensing of a voltage across the bus bar or sensing of a temperature at the bus bar;

a vent shield plate of the integrated sensing and bus bar subassembly disposed on the carrier between the battery cells of the stack of battery cells and the sensor disposed on the bus bar, wherein the vent shield plate is configured to absorb kinetic energy and thermal energy from the battery cell effluent, comprises a material having an isotropic thermal conductivity property to enable heat of the effluent to be directed in a first direction, and is configured to direct the battery cell effluent in a second direction to an opening in the integrated sensing and bus bar subassembly, the second direction being different from the first direction; and a module cover disposed over the integrated sensing and bus bar subassembly and against the housing, wherein the module cover and the integrated sensing and bus bar subassembly at least partially define a venting chamber configured to receive the battery cell effluent after the battery cell effluent has passed through the opening, and wherein the module cover comprises a vent configured to direct the battery cell effluent out of the battery module.

2. A battery module, comprising:

a housing;

a receptacle of the housing configured to receive a stack of battery cells, wherein each battery cell of the stack of battery cells has an end comprising a battery cell terminal and a battery cell vent, and the battery cell vent is configured to exhaust battery cell effluent;

an integrated sensing and bus bar subassembly positioned directly along a vent path of the battery cell effluent;

a carrier of the integrated sensing and bus bar subassembly, wherein the carrier comprises a first material;

a bus bar of the integrated sensing and bus bar subassembly integrated onto the carrier and configured to electrically couple battery cells of the stack of battery cells in an electrical arrangement;

a sensor of the integrated sensing and bus bar subassembly disposed on the bus bar and configured to enable sensing of a voltage across the bus bar or sensing of a temperature at the bus bar;

a vent shield plate of the integrated sensing and bus bar subassembly disposed on the carrier between the battery cells of the stack of battery cells and the sensor disposed on the bus bar, wherein the vent shield plate comprises a second material the second material having a lower heat capacity than the first material, wherein the vent shield plate is configured to absorb kinetic energy and thermal energy from the battery cell effluent and to direct the battery cell effluent to an opening in the integrated sensing and bus bar subassembly; and a module cover disposed over the integrated sensing and bus bar subassembly and against the housing, wherein the module cover and the integrated sensing and bus bar subassembly at least partially define a venting chamber configured to receive the battery cell effluent after the battery cell effluent has passed through the opening, and wherein the module cover comprises a vent configured to direct the battery cell effluent out of the battery module, wherein the second material of the vent shield plate has a property of isotropic thermal conductivity to direct heat in a particular direction that enables heat to be directed in a direction different from the direction of effluent venting.

3. The battery module of claim 2, wherein the housing comprises a third material.

4. The battery module of claim 3, wherein the second material has a lower heat capacity than the third material.

5. The battery module of claim 4, wherein the vent shield plate comprises a metal or a ceramic, and the housing comprises a polymer.

6. The battery module of claim 2, wherein the battery cell effluent contacts the sensor.

7. The battery module of claim 2, wherein the sensor is electrically coupled to a controller and the controller is configured to disconnect a flow of electricity from the battery module to a load when the sensor sends a signal that includes a temperature or voltage that exceeds a threshold value stored in the controller.

8. The battery module of claim 2, wherein the integrated sensing and bus bar subassembly forms a bottom wall of the venting chamber.

9. The battery module of claim 2, wherein the vent shield plate is configured to reduce a temperature of the battery cell effluent that is directed to the opening in the integrated sensing and bus bar subassembly.

10. The battery module of claim 2, wherein the integrated sensing and bus bar subassembly blocks the battery cell effluent from flowing towards the stack of battery cells from the venting chamber.

11. The battery module of claim 2, wherein the second material of the vent shield plate is comprised of a material having a low heat capacity.

* * * * *